(12) United States Patent
Yang et al.

(10) Patent No.: US 11,236,440 B2
(45) Date of Patent: Feb. 1, 2022

(54) COPPER-ZINC-ALUMINUM-IRON SINGLE CRYSTAL ALLOY MATERIAL

(71) Applicant: Xiamen University, Fujian (CN)

(72) Inventors: Shuiyuan Yang, Fujian (CN); Jixun Zhang, Fujian (CN); Xinyu Qing, Fujian (CN); Lipeng Guo, Fujian (CN); Cuiping Wang, Fujian (CN); Xingjun Liu, Fujian (CN); Jinbin Zhang, Fujian (CN); Yixiong Huang, Fujian (CN)

(73) Assignee: XIAMEN UNIVERSITY, Fujian (CN)

( * ) Notice: Subject to any disclaimer, the term of this patent is extended or adjusted under 35 U.S.C. 154(b) by 266 days.

(21) Appl. No.: 16/701,231

(22) Filed: Dec. 3, 2019

(65) Prior Publication Data
US 2020/0199779 A1 Jun. 25, 2020

(30) Foreign Application Priority Data
Dec. 24, 2018 (CN) .......................... 201811579865.2

(51) Int. Cl.
*C22C 9/04* (2006.01)
*C30B 29/52* (2006.01)
*C30B 1/02* (2006.01)

(52) U.S. Cl.
CPC ................ *C30B 29/52* (2013.01); *C22C 9/04* (2013.01); *C30B 1/02* (2013.01)

(58) Field of Classification Search
CPC ..................................... C22C 9/04; C22F 1/08
See application file for complete search history.

(56) References Cited

U.S. PATENT DOCUMENTS 3,097,093 A * 7/1963 Fox ........................... C22C 9/04
420/475

OTHER PUBLICATIONS

N. P. Goss, New Development in Electrical Strip Steels Characterized by Fine Grain Structure Approaching the Properties of a Single Crystal, Discussion—Electrical Steels, Sixteenth Annual Convention of the Society held in New York City. Oct. 1 to 5, 1934, p. 1.

Toshihiro Omori, et al., Abnormal Grain Growth Induced by Cyclic Heat Treatment, Science (American Association for the Advancement of Science), Sep. 27, 2013, pp. 1500-1502, vol. 341, Issue 6153, Washington, DC.

Angelo Fernando Padilha, et al., Annealing of Cold-worked Austenitic Stainless Steels, ISIJ International, 2003, pp. 135-143, vol. 43 (2003), No. 2.

(Continued)

*Primary Examiner* — Jessee R Roe
(74) *Attorney, Agent, or Firm* — Tutunjian & Bitetto, P.C.

(57) ABSTRACT

The present invention discloses a copper-zinc-aluminum-iron single crystal alloy material having an ultra-large grain structure of 5-50 cm grade, obtained by annealing an as-cast alloy having a polycrystalline structure through a single phase region of 800-960° C. for 2-105 h, where the as-cast alloy includes, by weight percentage, 62-82% of copper, 6-29% of zinc, 5-12% of aluminum, and 2-5% of iron. In the present invention, the alloy compositions have an essential difference and are a copper-zinc-aluminum-iron quaternary alloy, and the iron element is an indispensable alloying element. The preparation process of the present invention is extremely simple and very easy to implement and has a very good application prospect.

12 Claims, 6 Drawing Sheets
(6 of 6 Drawing Sheet(s) Filed in Color)

(56) References Cited

OTHER PUBLICATIONS

Hiroyuki Kato et al., Cyclic stress-strain response of superelastic Cu—Al—Mn alloy single crystals, Materials Science and Engineering A264, May 1999, pp. 245-253, vol. 264, Issues 1-2, Elsevier.

J. Ciulik, et al., Dynamic abnormal grain growth: A new method to produce single crystals, Scripta Materialia, Nov. 2009, pp. 895-898, vol. 61, Issue 9, Elsevier.

F.J. Humphreys, et al., Recrystallization and Related Annealing Phenomena 2nd Edition, 2004, pp. 1-658, Elsevier.

T. Saburi et al., Stress-Induced Martensitic Transmformations in Cu—Zn—Al and Cu—Zn—Ga Alloys, International Conference on Martensitic Transformations, Dec. 1982, pp. C4-633-C4-638, vol. 43, No. C4, ICOMAT-82.

H. Kato et al., Superelasticity and Shape Memory Effect in Cu-23at.% Al-7at.%Mn Alloy Single Crystals, Acta Metallurgica et Materialia, Apr. 1994, pp. 1359-1365, vol. 42, Issue 4, Elsevier.

K. Otsuka, et al., Superelasticity Effects and Stress-Induced Martensitic Transformations in Cu—Al—Ni Alloys, Acta Metallurgica, Mar. 1976, pp. 207-225, Elsevier.

S. Ignacova, et al., The reorientation of the 2H martensite phase in Cu—Al—Mn shape memory single crystal alloy, Materials Science and Engineering A, May 25, 2008, pp. 526-531, vols. 481-482, Elsevier.

Tomoe Kusama et al., Ultra-large single crystals by abnormal grain growth, Nature Communications, Aug. 25, 2017, p. 354, vol. 8(1).

\* cited by examiner

FIG. 1

Quench after 3 h at 850°C

Ingot casting ⟶ Super-large grain

COPPER-ZINC-ALUMINUM-IRON SINGLE CRYSTAL ALLOY MATERIAL

TECHNICAL FIELD

The present invention belongs to the technical field of metal single crystal alloys, and particularly relates to a copper-zinc-aluminum-iron single crystal alloy material.

BACKGROUND

Single crystal alloys generally have more excellent mechanical and functional properties than polycrystalline alloys, and thus have broad application prospects. Metal materials obtained by a conventional heat treatment process (smelting, solidification, and annealing) each have a polycrystalline structure, and bulk single crystal alloys can only be obtained by some special devices and processes, such as directional solidification process (1. Otsuka, K., Wayman, C. M., Nakai, K., Sakamoto, H. & Shimizu, K. Superelasticity effects and stress-induced martensitic transformations in Cu—Al—Ni alloys. Acta Metall. 24, 207-226, 1976; 2. Saburi, T., Inada, Y., Nenno, S. & Hori, N. Stress-induced martensitic transformations in Cu—Zn—Al and Cu—Zn—Ga alloys. J. Phys. 43, 633-638, 1982; 3. Kato, H., Dutkiewicz, J. & Miura, S. Super elasticity and shape memory effect in Cu-23 at % Al-7 at % Mn alloy single crystals. Acta Metall. Mater: 42, 1359-1365, 1994; 4. Kato, H., Ozu, T., Hashimoto, S., Miura, S. Cyclic stress-strain response of superelastic Cu—Al—Mn alloy single crystals. Mater. Sci. Eng. A. 264, 245-253, 1999; 5. The reorientation of the 2H martensite phase in Cu—Al—Mn shape memory single crystal alloy. Mater. Sci. Eng. A. 481-482, 526-531, 2008).

Some metal materials may undergo abnormal grain growth during annealing or dynamic recrystallization after macro-deformation, and thus single crystal materials can be obtained, but only some sheets or wires with simple shapes can be acquired by means of these methods (1. Goss, N. P. New development in electrical strip steels characterized by fine grain structure approaching the properties of a single crystal. Trans. ASM 23, 511-531, 1934; 2. Humphreys, F J & Hatherly, M. in Recrystallization and related annealing phenomena (Elsevier, Oxford, Ed. 2, 2004); 3. Padilha, A F, Plaut, R L & Rios, P R Annealing of cold-worked austenitic stainless steels. ISIJ Int. 43, 135-143, 2003; 4. Ciulik, J. & Taleff, E M Dynamic abnormal Grain growth: A new method to produce single crystal. Scr. Mater. 61, 895-898, 2009). Moreover, the course is relatively complicated, a process is cumbersome and has high cost, bulk single crystal materials cannot be obtained, and thus these methods are not suitable for practical application.

Japan's Omori et al. found a copper-aluminum-manganese ternary alloy material including, by mass ratio, 7.8-8.8% of aluminum, 7.2-14.3% of manganese, and the balance copper (1. Omori, T. et al. Abnormal grain growth induced by cyclic heat treatment. Science 341, 1500-1502, 2013; 2. Kusama, T., et al. Ultra-large single crystals by abnormal grain growth. Nat. Comm. 8, 354-(1-9), 2017). The alloy material does not need to undergo macroscopic deformation, and a super-large grain structure can be obtained through dozens of thermal cycles. The thermal cycle process is as follows: an as-cast alloy is first homogenized and thermally treated in a single phase region at a high temperature of 900° C., and then the alloy is slowly cooled (the cooling rate is from 0.5° C./min to 3.3° C./min) to 500° C., 740° C. or 760° C. and then slowly heated (the heating rate is 10° C./min) to 900° C. for short-time heat preservation. The thermal cycles are performed dozens of times according to the foregoing process and then quenching is performed. However, the foregoing cyclic thermal treatment process is not only time-consuming but also extremely cumbersome, and the requirements for the cooling/heating rate are very strict, which is not conducive to practical production applications.

So far, there are not many application of metal single crystal alloys, mainly as high-temperature single crystal alloys, which are primarily used in aerospace and other fields. This is mainly because metal single crystal alloys and especially bulk single crystal alloys can only be obtained by means of special devices and process materials, the production efficiency is low, and the cost is high. Therefore, it is of great significance and very broad application prospects to develop a bulk single crystal metal alloy material that can be obtained by a simple process.

SUMMARY

An objective of the present invention is to overcome the deficiencies of the prior art and to provide a copper-zinc-aluminum-iron single crystal alloy material.

Technical solutions of the present invention are as follows:

a copper-zinc-aluminum-iron single crystal alloy material having an ultra-large grain structure of 5-50 cm grade is obtained by annealing an as-cast alloy having a polycrystalline structure through a single phase region of 800-960° C. for 2-105 h, where the as-cast alloy includes, by weight percentage, 62-82% copper, 6-29% zinc, 5-12% aluminum, and 2-5% iron.

The iron is combined with aluminum and zinc to form a body-centered cubic β (FeAlZn) phase, and copper, zinc and aluminum are combined to form a body-centered cubic β (CuZnAl) phase. The as-cast alloy has a phase separation structure of the body-centered cubic β (CuZnAl) and the body-centered cubic β(FeAlZn).

In a preferred embodiment of the present invention, the as-cast alloy includes, by weight percentage, 62.5-81.5% of copper, 6.5-28.5% of zinc, 5.5-11.5% of aluminum, and 2.3-4.7% of iron.

In a preferred embodiment of the present invention, the as-cast alloy includes, by weight percentage, 63-81% of copper, 7-28% of zinc, 6-11% of aluminum, and 2.5-4.5% of iron.

In a preferred embodiment of the present invention, the as-cast alloy includes, by weight percentage, 63.5-80.5% of copper, 7.5-26.5% of zinc, 6.5-10.5% of aluminum, and 2.5-4% of iron.

In a preferred embodiment of the present invention, the as-cast alloy includes, by weight percentage, 64-80% of copper, 8-26% of zinc, 6.5-10% of aluminum, and 2.5-3.5% of iron.

In a preferred embodiment of the present invention, the as-cast alloy includes, by weight percentage, 64-78.5% of copper, 9-27% of zinc, 6-9.5% of aluminum, and 2.5-3% of iron.

In a preferred embodiment of the present invention, the copper-zinc-aluminum-iron single crystal alloy material is obtained by annealing an as-cast alloy having a polycrystalline structure through a single phase region of 800-950° C. for 2-100 h.

The present invention has the following beneficial effects:

1. In the prior art, a copper-aluminum-manganese ternary alloy disclosed by Omori et al. includes (by mass ratio, the same below), 7.8-8.8% of aluminum, 7.2-14.3% of manganese, and the balance copper. The compositions of the copper-zinc-aluminum-iron alloy disclosed in the present invention are: copper (65-80%); zinc (7-23%); aluminum (7-12%); and iron (2-5%). In the present invention, the alloy compositions have an essential difference and are a copper-zinc-aluminum-iron quaternary alloy, and the iron element is an indispensable alloying element.

2. In the prior art, the copper-aluminum-manganese ternary alloy disclosed by Omori et al. does not undergo body-centered cubic phase separation, and therefore does not have a phase separation structure of body-centered cubic β (CuZnAl) and body-centered cubic β (FeAlZn). In the present invention, the copper-zinc-aluminum-iron alloy has a phase separation phenomenon and has unique microscopic structure characteristics, namely a phase separation structure in which body-centered cubic β (CuZnAl) and very fine body-centered cubic β (FeAlZn) coexist, and the very fine body-centered cubic β (FeAlZn) is a decisive factor in the formation of super-large grains in the high-temperature thermal treatment of the alloy.

3. In the prior art, the copper-aluminum-manganese ternary alloy disclosed by Omori et al. must undergo dozens of thermal cycles before the super-large grain structure can be obtained, while for the phase-separated copper-zinc-aluminum-iron quaternary alloy of the present invention, ultra-large single crystals can be obtained only by further annealing an as-cast polycrystalline alloy. Therefore, a process for preparing the copper-zinc-aluminum-iron single crystal alloy material of the present invention is extremely simple and very easy to implement and has a very good application prospect.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present principles may be better understood in accordance with the following exemplary figures, in which.

DETAILED DESCRIPTION

The technical solutions of the present invention will be further described below through specific embodiments with reference to accompanying drawings.

All alloys in the present invention have a common microstructure, that is, the alloys each include a body-centered cubic β (CuZnAl)+body-centered cubic β (FeAlZn) precipitated phase caused by phase separation.

Embodiment 1

Figure 1:
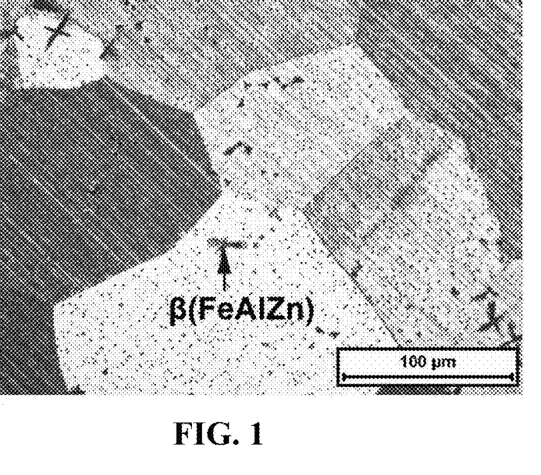
FIG. 1 is a microstructure diagram of an as-cast alloy in Embodiment 1 of the present invention; where the alloy is composed of body-centered cubic β (CuZnAl) and a very fine body-centered cubic β (FeAlZn) precipitated phase.
Figure 2A:
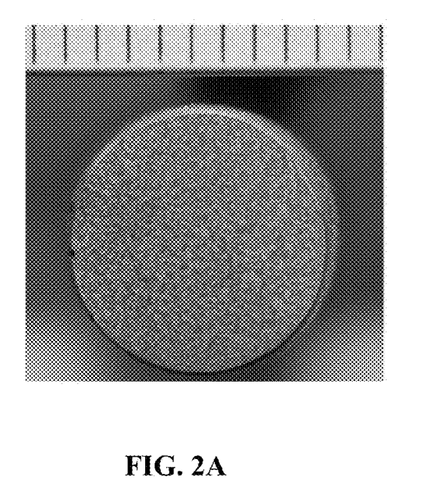
FIGS. 2A and 2B are photographs of an as-cast alloy according to a first embodiment of the present invention and an alloy with 5 cm super-large grains obtained by thermal treatment at 900° C. for 40 h or more.
Figure 2B:
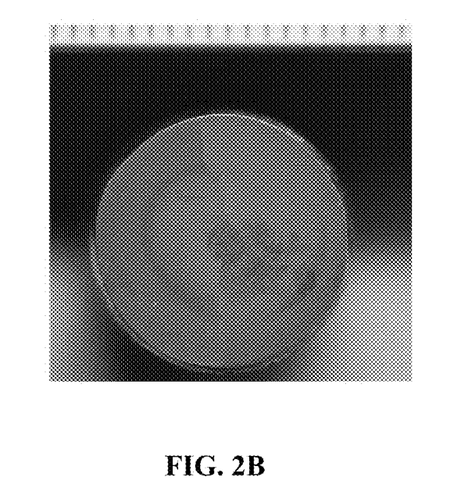

Copper, zinc, aluminum, and iron metal materials were compounded according to, by mass percentage, 66% of copper, 25% of zinc, 6% of aluminum, and 3% of iron and then the alloy was smelted, and after the alloy was cooled, an as-cast alloy was obtained. The as-cast alloy was annealed at 900° C., and after annealing for 40 h, quenching was performed to obtain an alloy material with a 5 cm super-large grain structure, and results of the crystal grains are shown in FIGS. 1, 2A and 2B.

Embodiment 2

Figure 3A:
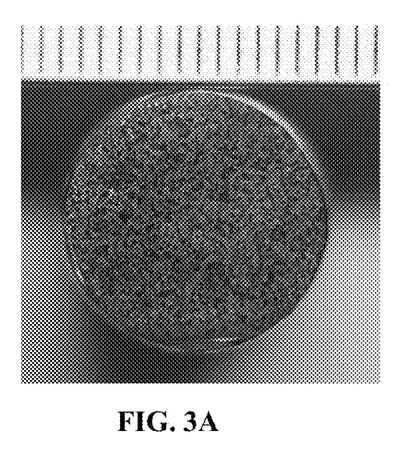
FIGS. 3A and 3B are photographs of an as-cast alloy according to a second embodiment of the present invention and an alloy with 15 cm super-large grains obtained by thermal treatment at 940° C. for 50 h or more.
Figure 3B:
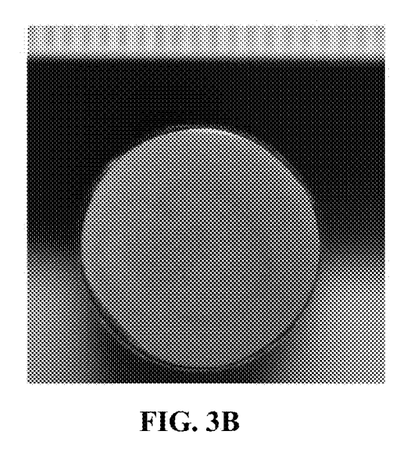

Copper, zinc, aluminum, and iron metal materials were compounded according to, by mass percentage, 64% of copper, 27% of zinc, 6% of aluminum, and 3% of iron and then the alloy was smelted, and after the alloy was cooled, an as-cast alloy was obtained. The as-cast alloy was annealed at 940° C., and after annealing for 50 h, quenching was performed to obtain an alloy material with a 15 cm super-large grain structure, and results are shown in FIGS. 3A and 3B.

Embodiment 3

Figures 4A, 4B:
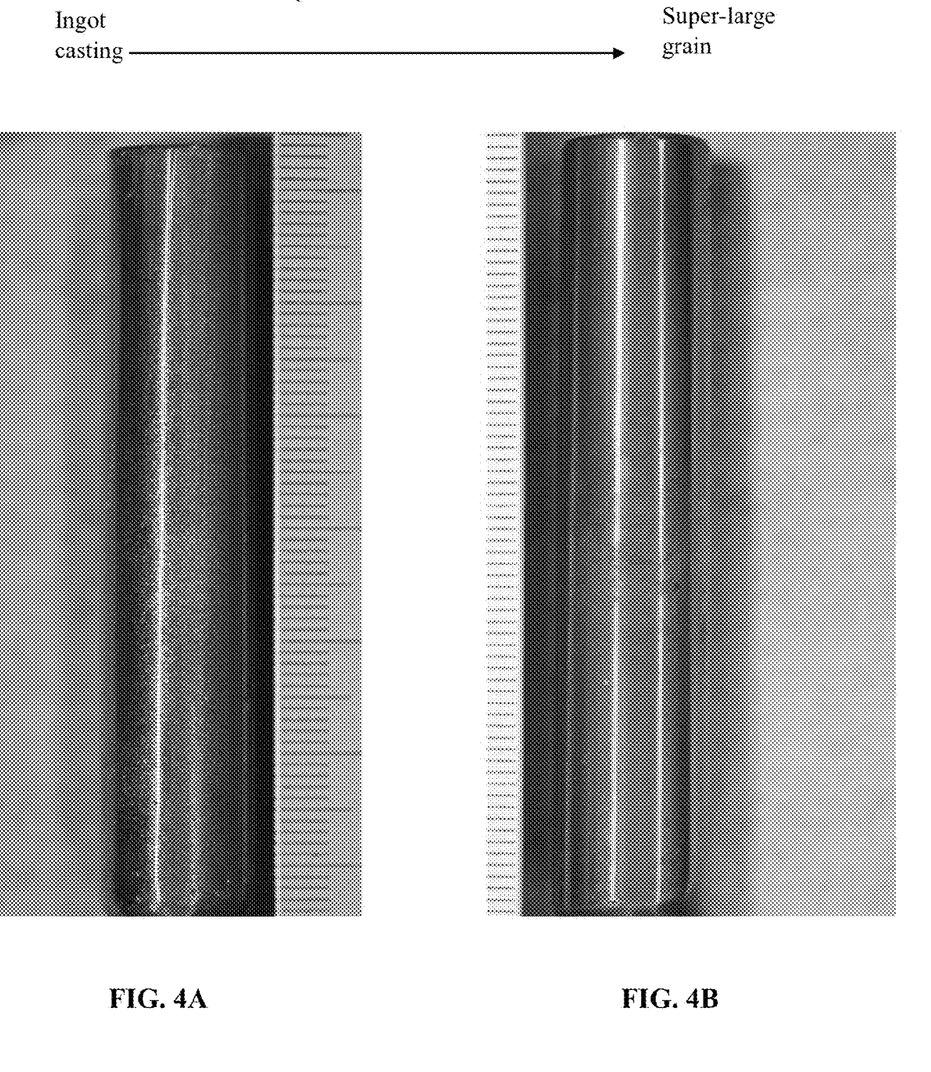
FIGS. 4A and 4B are photographs of an as-cast alloy according to a third embodiment of the present invention and an alloy with 7 cm super-large grains obtained by thermal treatment at 930° C. for 60 h or more.

Copper, zinc, aluminum, and iron metal materials were compounded according to, by mass percentage, 73% of copper, 16% of zinc, 8% of aluminum, and 3% of iron and then the alloy was smelted, and after the alloy was cooled, an as-cast alloy was obtained. The as-cast alloy was annealed at 930° C., and after annealing for 60 h, quenching was performed to obtain an alloy material with a 7 cm super-large grain structure, and results are shown in FIGS. 4A and 4B.

Embodiment 4

Figure 5:
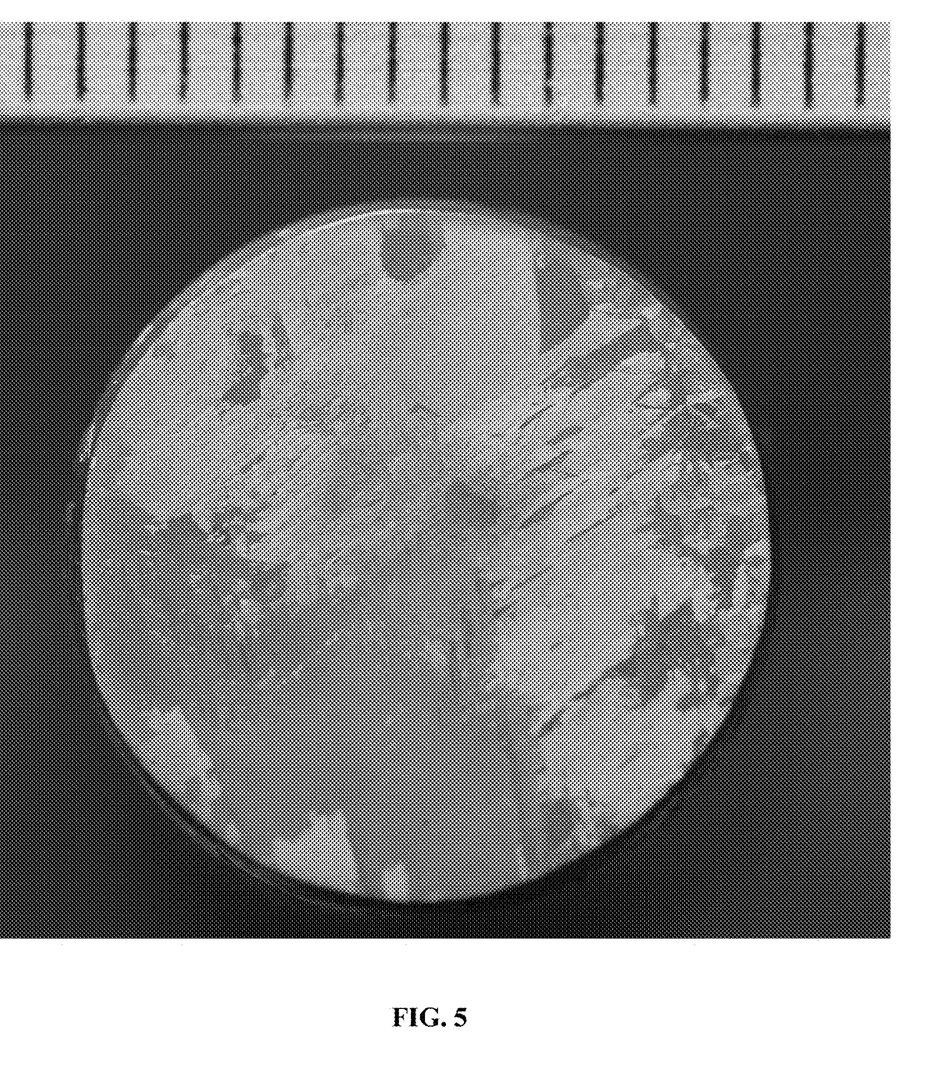
FIG. 5 is a photograph of an as-cast alloy according to a fourth embodiment of the present invention and an alloy with 15 cm super-large grains obtained by thermal treatment at 930° C. for 90 h or more.

Copper, zinc, aluminum, and iron metal materials were compounded according to, by mass percentage, 78.2% of copper, 9.4% of zinc, 9.4% of aluminum, and 3% of iron and then the alloy was smelted, and after the alloy was cooled, an as-cast alloy was obtained. The as-cast alloy was annealed at 930° C., and after annealing for 90 h, quenching was performed to obtain an alloy material with a 15 cm super-large grain structure, and results are shown in FIG. 5.

Embodiment 5

Figure 6A:
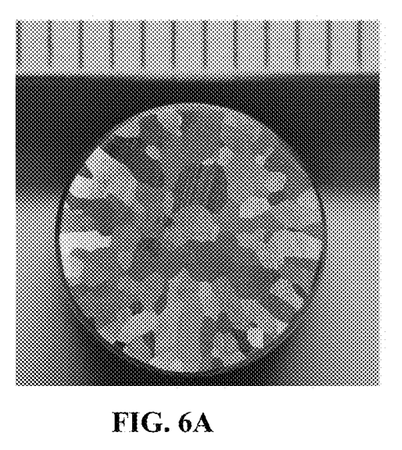
FIGS. 6A and 6B are photographs of an as-cast alloy according to a fifth embodiment of the present invention and an alloy with super-large grains not obtained by thermal treatment at 850° C. for 10 h.
Figure 6B:
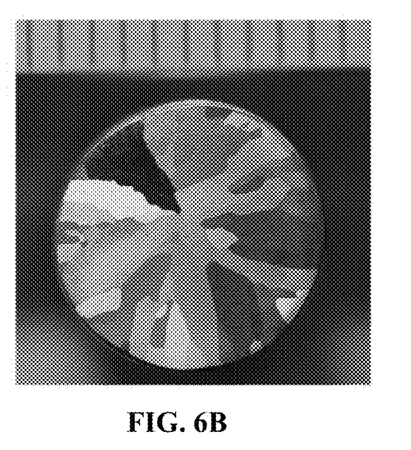

Copper, zinc, aluminum, and iron metal materials were compounded according to, by mass percentage, 72% of copper, 18% of zinc, 8% of aluminum, and 2% of iron and then the alloy was smelted, and after the alloy was cooled, an as-cast alloy was obtained. The as-cast alloy was annealed at 850° C., and after annealing for 10 h, quenching was performed, an alloy material with a super-large grain structure was not obtained, and results are shown in FIGS. 6A and 6B.

Embodiment 6

Figure 7:
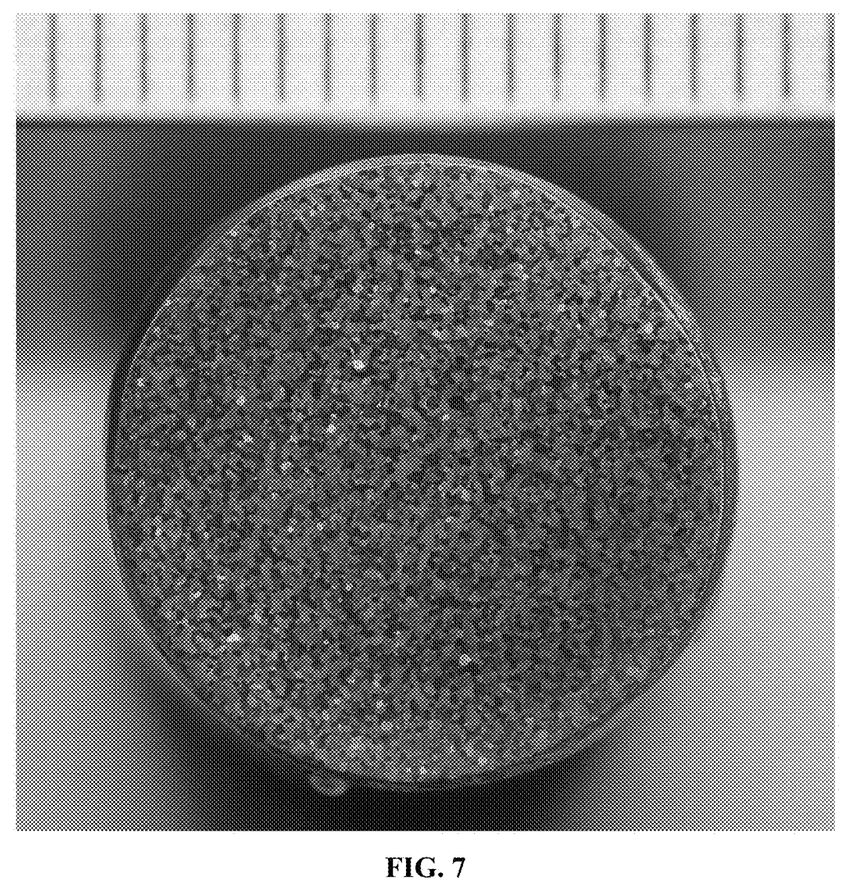
FIG. 7 is a photograph of an as-cast alloy according to an embodiment of the present invention and an alloy with super-large grains not obtained by thermal treatment at 800° C. for 2 h.

Copper, zinc, aluminum, and iron metal materials were compounded according to, by mass percentage, 72% of copper, 16% of zinc, 8% of aluminum, and 4% of iron and then the alloy was smelted, and after the alloy was cooled, an as-cast alloy was obtained. The as-cast alloy was annealed at 800° C., and after annealing for 2 h, quenching was performed, an alloy material with an ultra-large crystal grain structure was not obtained, and results are shown in FIG. 7.

Embodiment 7

Copper, zinc, aluminum, and iron metal materials were compounded according to, by mass percentage, 62% of copper, 29% of zinc, 6% of aluminum, and 3% of iron and then the alloy was smelted, and after the alloy was cooled, an as-cast alloy was obtained. The as-cast alloy was annealed at 850° C., and after annealing for 5 h, quenching was performed, and an alloy material with a super-large grain structure was not obtained.

Embodiment 8

Copper, zinc, aluminum, and iron metal materials were compounded according to, by mass percentage, 62% of copper, 24% of zinc, 12% of aluminum, and 2% of iron and then the alloy was smelted, and after the alloy was cooled, an as-cast alloy was obtained. The as-cast alloy was annealed at 950° C., and after annealing for 2 h, quenching was performed, and an alloy material with a super-large grain structure was not obtained.

Embodiment 9

Copper, zinc, aluminum, and iron metal materials were compounded according to, by mass percentage, 69% of copper, 20.5% of zinc, 8% of aluminum, and 2.5% of iron and then the alloy was smelted, and after the alloy was cooled, an as-cast alloy was obtained. The as-cast alloy was annealed at 920° C., and after annealing for 90 h, quenching was performed, and an alloy material with a 45 cm super-large grain structure was obtained.

Embodiment 10

Copper, zinc, aluminum, and iron metal materials were compounded according to, by mass percentage, 67% of copper, 22% of zinc, 8% of aluminum, and 3% of iron and then the alloy was smelted, and after the alloy was cooled, an as-cast alloy was obtained. The as-cast alloy was annealed at 920° C., and after annealing for 48 h, quenching was performed, and an alloy material with a 7 cm ultra-large crystal grain structure was obtained.

Embodiment 11

Copper, zinc, aluminum, and iron metal materials were compounded according to, by mass percentage, 69% of copper, 20% of zinc, 8% of aluminum, and 3% of iron and then the alloy was smelted, and after the alloy was cooled, an as-cast alloy was obtained. The as-cast alloy was annealed at 910° C., and after annealing for 50 h, quenching was performed, and an alloy material with a 15 cm ultra-large crystal grain structure was obtained.

Embodiment 12

Copper, zinc, aluminum, and iron metal materials were compounded according to, by mass percentage, 77% of copper, 12% of zinc, 8% of aluminum, and 3% of iron and then the alloy was smelted, and after the alloy was cooled, an as-cast alloy was obtained. The as-cast alloy was annealed at 920° C., and after annealing for 48 h, quenching was performed, and an alloy material with a 7 cm ultra-large crystal grain structure was obtained.

Embodiment 13

Copper, zinc, aluminum, and iron metal materials were compounded according to, by mass percentage, 82% of copper, 8% of zinc, 5% of aluminum, and 5% of iron and then the alloy was smelted, and after the alloy was cooled, an as-cast alloy was obtained. The as-cast alloy was annealed at 900° C., and after annealing for 3 h, quenching was performed, and an alloy material with a super-large grain structure was not obtained.

The above are only the preferred embodiments of the present invention, and thus the scope of the present invention is not limited thereto. Equivalent changes and modifications made in accordance with the patent scope of the present invention and the contents of the specification shall fall within the scope of the present invention.

What is claimed is:

1. A copper-zinc-aluminum-iron single crystal alloy material, wherein the copper-zinc-aluminum-iron single crystal alloy material has an ultra-large grain structure of 5-50 cm grade, and is obtained by annealing an as-cast alloy having a polycrystalline structure through a single phase region of 800-960° C. for 2-105 h, wherein the as-cast alloy comprises, by weight percentage, 62-82% of copper, 6-29% of zinc, 5-12% of aluminum, and 2-5% of iron;
wherein iron is combined with aluminum and zinc to form a body-centered cubic β (FeAlZn) phase, copper, zinc and aluminum are combined to form a body-centered cubic β (CuZnAl) phase, and the as-cast alloy has a phase separation structure of the body-centered cubic β (CuZnAl) and the body-centered cubic β (FeAlZn).

2. The copper-zinc-aluminum-iron single crystal alloy material according to claim 1, wherein the copper-zinc-aluminum-iron single crystal alloy material is obtained by annealing an as-cast alloy having a polycrystalline structure through a single phase region of 800-950° C. for 2-100 h.

3. The copper-zinc-aluminum-iron single crystal alloy material according to claim 1, wherein the as-cast alloy comprises, by weight percentage, 62.5-81.5% of copper, 6.5-28.5% of zinc, 5.5-11.5% of aluminum, and 2.3-4.7% of iron.

4. The copper-zinc-aluminum-iron single crystal alloy material according to claim 3, wherein the copper-zinc-aluminum-iron single crystal alloy material is obtained by annealing an as-cast alloy having a polycrystalline structure through a single phase region of 800-950° C. for 2-100 h.

5. The copper-zinc-aluminum-iron single crystal alloy material according to claim 1, wherein the as-cast alloy comprises, by weight percentage, 63-81% of copper, 7-28% of zinc, 6-11% of aluminum, and 2.5-4.5% of iron.

6. The copper-zinc-aluminum-iron single crystal alloy material according to claim 5, wherein the copper-zinc-aluminum-iron single crystal alloy material is obtained by annealing an as-cast alloy having a polycrystalline structure through a single phase region of 800-950° C. for 2-100 h.

7. The copper-zinc-aluminum-iron single crystal alloy material according to claim 1, wherein the as-cast alloy comprises, by weight percentage, 63.5-80.5% of copper, 7.5-26.5% of zinc, 6.5-10.5% of aluminum, and 2.5-4% of iron.

8. The copper-zinc-aluminum-iron single crystal alloy material according to claim 7, wherein the copper-zinc-aluminum-iron single crystal alloy material is obtained by annealing an as-cast alloy having a polycrystalline structure through a single phase region of 800-950° C. for 2-100 h.

9. The copper-zinc-aluminum-iron single crystal alloy material according to claim 1, wherein the as-cast alloy comprises, by weight percentage, 64-80% of copper, 8-26% of zinc, 6.5-10% of aluminum, and 2.5-3.5% of iron.

10. The copper-zinc-aluminum-iron single crystal alloy material according to claim 9, wherein the copper-zinc-aluminum-iron single crystal alloy material is obtained by annealing an as-cast alloy having a polycrystalline structure through a single phase region of 800-950° C. for 2-100 h.

11. The copper-zinc-aluminum-iron single crystal alloy material according to claim 1, wherein the as-cast alloy comprises, by weight percentage, 64-78.5% of copper, 9-27% of zinc, 6-9.5% of aluminum, and 2.5-3% of iron.

12. The copper-zinc-aluminum-iron single crystal alloy material according to claim 11, wherein the copper-zinc-aluminum-iron single crystal alloy material is obtained by annealing an as-cast alloy having a polycrystalline structure through a single phase region of 800-950° C. for 2-100 h.

* * * * *